United States Patent [19]

Dudziak et al.

[11] Patent Number: 4,847,569

[45] Date of Patent: Jul. 11, 1989

[54] AUTOMATIC CALIBRATION SYSTEM FOR A VOLTAGE CONTROL OSCILLATOR

[75] Inventors: Thaddeus J. Dudziak; Charles Lehmkuhl; David Badger, all of Indianapolis, Ind.

[73] Assignee: Wavetek Corporation, San Diego, Calif.

[21] Appl. No.: 16,926

[22] Filed: Feb. 20, 1987

[51] Int. Cl.$^4$ .............................................. H03L 7/00
[52] U.S. Cl. ..................................... 331/25; 328/155; 341/118
[58] Field of Search .......................... 328/155; 331/25; 340/347 CC; 364/900; 341/118, 119

[56] References Cited

U.S. PATENT DOCUMENTS

| | | | |
|---|---|---|---|
| 4,291,388 | 9/1981 | Ecker, Jr. et al. | 364/900 |
| 4,442,412 | 4/1984 | Smith et al. | 331/25 |
| 4,677,394 | 6/1987 | Vollmer | 331/25 |

Primary Examiner—William M. Shoop, Jr.
Assistant Examiner—Marc S. Hoff
Attorney, Agent, or Firm—Ellsworth R. Roston; Charles H. Schwartz

[57] ABSTRACT

A signal generator including a calibration circuit for providing periodic recalibration of the generator, including a reference frequency source for producing a fixed frequency signal. A voltage controlled oscillator (VCO) for producing a variable frequency signal in accordance with a voltage input to the VCO. An adjustable dividing network coupled to the VCO for dividing the variable frequency signal by a particular divider (N) to produce an output signal equal to the variable frequency signal divided by "N". A phase detector coupled to the reference frequency source and the dividing network for producing an error signal in accordance with the difference between the fixed frequency signal and the output signal. A filter coupled to the phase detector for producing an error voltage signal representative of the error signal. A programmable nonvolatile storage for storing a plurality of individual values representative of the plurality of frequency steps from the VCO. A converter coupled to the programmable storage for converting the stored values to a plurality of individual voltage signals. A summer coupled to the filter and the converter for summing the signals and applying the summed signals to the VCO for controlling the VCO to particular frequency steps. A comparator coupled to the phase detector for comparing the error signal to a fixed reference for producing a control signal in accordance with the comparison, and a controller coupled to the comparator and the programmable storage for reprogramming the plurality of individual values to recalibrate the frequency steps in accordance with the control signal.

27 Claims, 1 Drawing Sheet

AUTOMATIC CALIBRATION SYSTEM FOR A VOLTAGE CONTROL OSCILLATOR

BACKGROUND OF THE INVENTION

1. Field of the Invention

The present invention relates to an automatic calibration system for a signal generator incorporating a voltage controlled oscillator. Specifically, the invention relates to a calibration system for recalibrating a look-up table stored in a programmable memory which look-up table stores values representing particular frequency steps from the voltage controlled oscillator.

2. Description of the Prior Art

In general, prior art signal generators use a voltage controlled oscillator to provide for a desired output frequency. One commonly used system includes a phase lock loop design incorporating a reference frequency as a first input to a phase detector. The output from the voltage controlled oscillator is applied through a divide network as a second input to the phase detector. The error signal output from the phase detector is applied to a loop filter and the output from the loop filter is a voltage equivalent of the error signal. The voltage output from the loop filter is used to modify the voltage controlled oscillator to produce the proper output frequency in accordance with the desired output frequency as represented by the value "N" of the divide network. Therefore, when it is desired to change the output frequency to a particular frequency, the divide network is adjusted to a particular value "N" which will in turn control the value of the error signal applied to the voltage controlled oscillator. The frequency of the voltage controlled oscillator will then slew to the particular frequency.

It can be seen that if it is desired to make large changes in the output frequency of the voltage controlled oscillator, it would be quite cumbersome to merely depend upon the single error signal to control the output frequency from the voltage controlled oscillator. In order to more rapidly change to the different frequencies, prior art systems have used stored values which represent stepped frequency values, such as one megahertz steps.

These stored values require a memory, such as a read-only memory with particular stored values. These stored values may be converted to voltage values using a digital-to-analog converter and applied to the voltage controlled oscillator so as to provide the proper control of voltage controlled oscillator. In a sense, the stored values represent a pretuning of the phase lock loop to the expected frequency steps and with a final tuning provided by the error signal produced by the phase detector. In this way the time response of the loop can be greatly increased since the switching to the different frequencies is more rapidly provided when the error voltage from the phase detector is kept as close to a zero value as possible. The prior art systems, therefore, provided for an improvement in the time response of the loop by applying the pretuned values to the voltage controlled oscillator as the divide network is changed and using the phase detector in the loop to make the small corrections to produce the final, more accurate, output frequency.

The closer the stored values representing the stepped frequencies are to the actual values, then the more accurate and quicker the frequency output may be provided for the desired frequencies. Typically, the stored values are customized for each individual frequency generator. The customizing is provided by using custom tables which are stored as a look-up table in a read-only memory such as an EPROM or a PROM. This look-up table is provided as part of a microprocessor and with the stored values provided in digital form and representative of particular voltage values which in turn are representative of particular frequency steps. When it is desired to provide a particular frequency output, the microprocessor accesses the read-only memory look-up table and provides for a digital value representative of this frequency. This digital value is then converted by the digital-to-analog converter into an analog voltage which in turn controls the voltage controlled oscillator to provide for the appropriate frequency output signal. Of course, the final tuning of the frequency signal is accomplished through the phase detector loop to produce a small error signal to make the final adjustment in the frequency.

Periodically, the look up system must be recalibrated because of aging in the system. In this way, the read-only memory such as the EPROM or PROM can be updated to reflect voltage values which are more closely representative of the desired steps after the aging process. In the prior art, this recalibration generally required that the signal generator be sent back to the manufacturer for recalibration. This is because the EPROM cannot be modified under the control of a microprocessor and can only be reprogrammed completely after first being erased by the use of an ultra-violet light source. The PROM cannot be modified at all once it has been programmed and so a new PROM must be programmed and inserted in the signal generator. In general, the manufacturer would check the voltage controlled oscillator and provide for a new read-only memory such as reprogrammed EPROM or a new PROM which now has the proper values to provide for the desired frequency steps. It can be appreciated that this process would be time consuming and expensive and more importantly, the signal generator equipment would be lost to the user for a considerable period of time during recalibration.

SUMMARY OF THE INVENTION

The present invention provides for a recalibration of a signal generator and with this calibration accomplished without the necessity of sending the signal generator back to the manufacturer. In addition, the recalibration is accomplished without having to dismantle the signal generating equipment in any way. In particular, the recalibration is accomplished automatically within the signal generator by initiating a calibration routine within a microprocessor. The calibration routine checks a look-up table formed in a programmable nonvolatile memory such as a battery backed-up random access memory (RAM) for particular values representing various frequency steps and provides for a storage in the programmable nonvolatile memory of updated values. In this way the signal generator may be periodically recalibrated at the users place of business. The battery backed-up RAM provides the desired characteristics of providing general storage which can be modified under program control and which retains its contents when power is removed. As another example of a programmable nonvolatile memory, an electrically alterable read only memory (EAROM) may be used.

The automatic recalibration is accomplished using the error signal normally generated within the phase lock loop. This error signal reflects the phase difference between the two frequency signals applied to the phase detector. The error signal is normally used to generate a voltage signal necessary to control the voltage controlled oscillator to a desired frequency value. As described above, a plurality of values representing voltages which in turn represent frequency steps are stored in a look up table in the microprocessor. These stored values may provide for a rapid control of the signal generator to the desired frequencies.

In the present invention, the recalibration may be accomplished by taking individual output signals representing individual frequency steps from the phase detector and applying these as one input to a comparator. The other input to the comparator is a reference signal such as ground or zero volts and with the output of the comparator then used to control the storage of new values in the look-up table in the programmable nonvolatile memory such as the battery backed-up RAM. This is accomplished for each frequency step and with the signal generator advanced step by step to generate the new storage value for the look up table for each step. By periodically running the signal generator through the automatic recalibration routine, the signal generator may be compensaated for problems such as aging so that the generator will always be available for use without having to send the generator back to the manufacturer for recalibration.

BRIEF DESCRIPTION OF THE DRAWINGS

A clearer understanding of the present invention will be had with reference to the following description and drawings wherein.

DESCRIPTION OF THE PREFERRED EMBODIMENT

Figure 1:
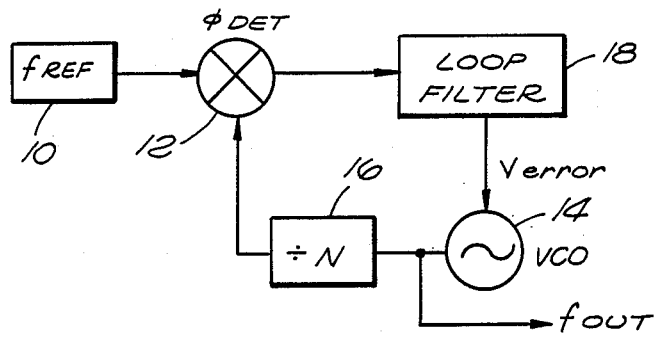
FIG. 1 illustrates a prior art frequency generator using a single phase lock loop.

As shown in FIG. 1, a prior art signal generator would include a reference frequency 10 which may be generated from a stable frequency source such as a crystal generator. The output from from the reference frequency 10 is applied as a first input to a phase detector 12. A voltage controlled oscillator 14 produces an output signal which is referred to as $f_{out}$. The output from the voltage controlled oscillator 14 is also applied to a divide network 16 which may subdivide $f_{out}$ by any value identified as "N". The output of the divide network 16 is applied as a second input to the phase detector 12.

The phase detector 12 will thereby provide an error signal representative of the difference between the output signals from the reference frequency 10 and from the divide network 16. This error signal from the phase detector 12 is applied to a loop filter 18 to produce an error voltage to control the frequency output of the voltage controlled oscillator 14. By changing the value "N" which is provided by the divide network 16, the output frequency $f_{out}$ will change accordingly. Therefore, $f_{out} = N \times f_{ref}$. In a like fashion, the value of the error voltage $V_{error}$ will change accordingly to cause the voltage controlled oscillator frequency to slew to the appropriate frequency value determined by "N". It is, therefore, possible to control the output frequency of the signal generator by adjusting the value "N" of the divide network 16.

Figure 2:
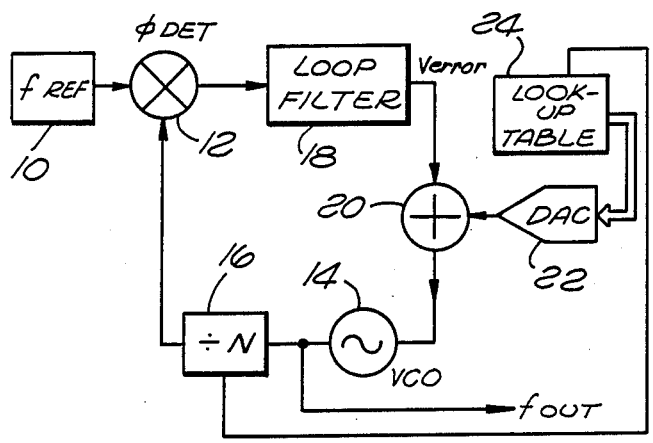
FIG. 2 illustrates a modification of the prior art system incorporating a look-up table and a DAC.

FIG. 2 illustrates an improvement on the system of FIG. 1 and also represents a prior art system. As can be seen in FIG. 2, similar components are given similar reference characters. The system of FIG. 2 additionally includes a summing network 20 which receives as a first input the voltage output signal from the loop filter 18. Additionally, a voltage output from a digital-to-analog converter (DAC) 22 is used as a second input signal to the summing network 20. The output from the summing network 20 provides for the control of voltage controlled oscillator 14.

The digital-to-analog converter 22 receives as an input signal, an output from a look-up table 24 such as an EPROM or PROM. The look-up table 24 includes a plurality of fixed values representing frequency steps and the look-up table may be formed by storing these fixed values in a device such as the EPROM or PROM. The divide network 16 and the look-up table 24 are interconnected so that as the divide network 16 is adjusted to change the frequency output from the voltage controlled oscillator 14, the look-up table provides for the appropriate signal to the digital-to-analog converter 22 to rapidly make this change. This type of system is used so that the signal generator may be rapidly changed to different frequencies.

The use of the stored values in the look-up table 24 representing the proper voltage inputs to the voltage controlled oscillator 14, therefore, pretunes the voltage controlled oscillator quickly to the expected frequency. Thereby, the time response of the signal generator can be greatly improved. Since it is desirable to provide for a very fast switching speed and lock to a desired frequency, it is important to try to keep the error voltage produced by the loop filter 18 as close to zero volts as possible. This is accomplished by custom designing for each unit the various values stored in the lookup table 24.

Periodically, the system must be recalibrated because of aging in the various components within the system. This recalibration would essentially consist of recalibrating the values for the look-up table 24 so that the look-up table is updated to reflect the proper voltage values representing the desired frequency steps after the aging process has occurred. Unfortunately, this must be accomplished on a periodic basis so as to maintain the accuracy and speed of response of the signal generator. At present this is accomplished by sending the unit back to the manufacturer for recalibration so that either new values are inserted into the lookup table 24, or the lookup table 24 is actually replaced with a new read-only memory which has stored within it new values that are representative of the signal generator as recalibrated. It can be appreciated that this process of recalibration is time consuming and expensive and results in the equipment being lost for use for a considerable period of time.

Figure 3:
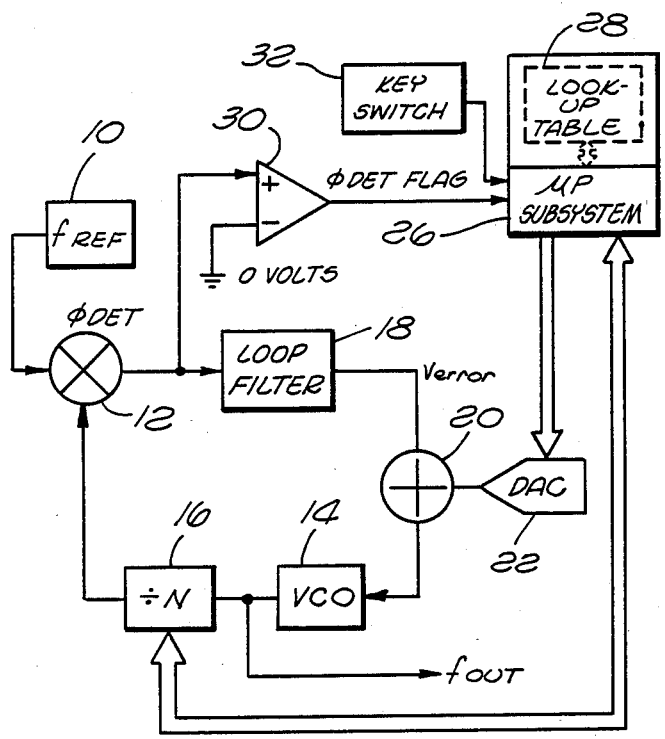
FIG. 3 illustrates a signal generator constructed in accordance with the teachings of the present invention.

FIG. 3 illustrates a signal generator constructed in accordance with the teachings of the present invention which signal generator overcomes the problems specified above. Components of the system of FIG. 3 which are substantially the same as those referred to above, are given the same reference character. In general, the present invention as shown in FIG. 3 includes the source of reference frequency 10 supplying the input signal $f_{ref}$ to the phase detector 12 and with the second input signal to the phase detector 12 provided by the output signal $f_{out}$ from the voltage controlled oscillator 14 as subdivided by the divider network 16. The error signal from the phase detector 12 is passed through the loop filter 18 to provide the error voltage $V_{error}$ for application to the summing network 20. The second input to the summing network 20 is provided from an output from the digital-to-analog converter 22. The voltage output from the summing network 20 controls the output frequency $f_{out}$ from the voltage controlled oscillator 14.

The present invention shown in FIG. 2 additionally includes a microprocessor subsystem 26 which includes an internal lookup table 28. The lookup table 28 would generally be a programmable nonvolatile memory which may be a battery back-up RAM or an EAROM. These types of memories are capable of being electronically programmed by a microprocessor so that the various stored values representing the progressive frequency steps for the voltage controlled oscillator 14 may not only be stored, but can be reprogrammed to have new values compensating for aging of any components in the system. In order to provide for the reprogramming of the look-up table 28 by the microprocessor 26, an input signal to the microprocessor is provided by a voltage comparator 30. The voltage comparator 30 includes as a first input, the error signal from the phase detector 12. This error signal is representative of a particular frequency step. The other input to the voltage comparator 30 is shown to be ground or zero volts, but may also be some other reference level so as to control the base line for all of the values entered into the lookup table 28.

In general, as the divide network 16 is changed to a new value "N", an error signal is produced from the phase detector 12 which in turn produces an output signal from the voltage comparator 30. This output signal may in turn be used as an input control to the microprocessor 26 to control the storage of a value in the look-up table 28 representative of an output frequency $f_{out}$ corresponding to the new value "N" for the divide network 16.

Figure 4:
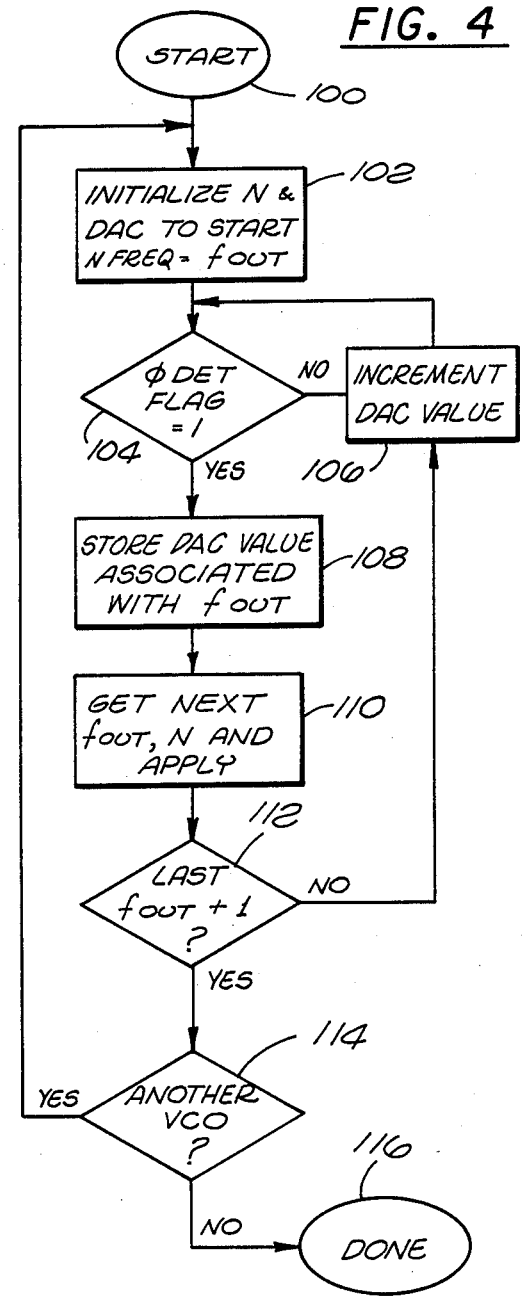
FIG. 4 is a flow chart illustrating the operation of the calibration routine of the signal generator of the present invention.

FIG. 4 shows a flow chart for the calibration routine controlled by the microprocessor 26 of the system of FIG. 3. As a first step in a calibration or recalibration of the signal generator, a start 100 is initiated. The start 100 may be provided automatically on a periodic basis, or in a preferred fashion the start 100 is initiated on a manual basis such as by a key operated start switch 32 shown in FIG. 3. After the start is initiated, as shown in block 102, a first value of "N" is initialized as well as an initial value supplied to the digital-to-analog converter 22. This starts the calibration process for the initial value of N x $f_{ref}=f_{out}$. This initial value produces an output error signal from the phase detector 12 which is applied to the comparator 30.

If the error output from the phase detector 12 is at a level greater than zero volts, then as shown in block 104, no phase detector flag signal is produced and applied to the microprocessor 26 to control an incremental change in the signal applied to the digital-to-analog converter 22. This is represented by the block 106. This incremental change in the value applied to the digital-to-analog converter 22 is continued until the output from the phase detector 12 is zero at which time the phase detector flag signal is produced. This is shown as a binary 1 and represents a "yes" signal. When such a "yes" signal is produced, as shown in block 108, the value representing the particular digital-to-analog value associated with the particular output frequency is then stored in the lookup table 28.

After this occurs, as shown in block 110, the next frequency output step and associated divide value "N" is determined and applied to the system. The next step in the routine, as shown in block 112, is to determine whether the output frequency is the same as the last output frequency plus one step. If this is not the case, then the incremental value to the digital-to-analog converter is changed, as shown by block 106, and the above process continues until the appropriate digital-to-analog value associated with the particular frequency output at the next step is then stored within the lookup table 28.

The calibration routine continues until all of the steps for the output frequency are checked and digital-to-analog values associated with all of these frequency steps are stored in the look-up table. When there are no more frequencies, then as shown in block 114, the microprocessor determines whether there is more than one voltage control oscillator as part of the signal generator. If there is more than one such voltage control oscillator, then the routine is restarted to operate with that additional voltage control oscillator. If not, then as shown in block 116, the operation of the routine is complete. It should be appreciated that the signal generator is shown in FIG. 3 to include a single voltage control oscillator. If it is desired that the signal generator operate over a very broad range of frequencies, then it may be necessary to include more than one voltage controlled oscillator within the system. The flow chart shown in FIG. 4 accommodates such a signal generator including more than one voltage controlled oscillator.

It is to be appreciated that the above description indicates that the calibrated routine functions by incrementing the DAC values and checking the phase detector output for a specific value. As an alternative, the routine could be operated by decrementing the DAC values and checking the opposite sense of the voltage comparator.

It can be seen, therefore, that the system of the present invention provides for automatic calibration or recalibration by using a error signal generated within the phase lock loop and specifically from the phase detector 12. This error signal represents a difference between the reference frequency $f_{ref}$ and the value "N" of the divide network divided into the output frequency $f_{out}$. The error signal is used to control a microprocessor to generate a voltage necessary to control the voltage controlled oscillator to a desired step in the frequency output. A value representative of this voltage signal and values representative of all of the other voltage signals representing the progressive frequency steps are then stored as a new look-up table in the microprocessor. The new look-up table may then be used to control the digital-to-analog converter to produce output signals representative of the desired frequency steps. The remaining portion of the system is then used to provide for fine tuning each frequency step by a normal phase lock loop technique.

The system of the present invention is very simple in construction yet allows for new voltage calibration information to be easily obtained from the existing phase lock loop without the necessity of sending the signal generator back to the factory for a manual recalibration. Because the signal generator can be easily recalibrated with the present invention, the recalibration can be accomplished more frequently. This provides for the following improvements in the general operation of the signal generator. Specifically, the frequent recalibration maximizes the locking range and minimizes the switching speed. It is also not necessary to provide custom read-only memories during the manufacture of the generator since the calibration routine is self-executing and may be used to provide for the desired calibration before the instrument is sold. As can be seen in the present disclosure, no modification of the phase lock loop is necessary and only one comparator is added to the system. Since the voltage comparison point is stable and as an example may be ground, this again simplifies the structure and insures accuracy of the system. Typically the prior art signal generators will include a microprocessor to allow for other operations so the present invention may be used in conjunction with such an existing microprocessor.

It can be seen, therefore, that the present invention provides for a simple reliable apparatus and method of producing an automatic calibration of a signal generator using the existing error detection techniques already present in the phase lock loop of the generator system and with this error detection providing for the control of a microprocessor to recalibrate the system and store new values representative of the desired frequency steps.

Although the invention has been described with reference to a particular embodiment, it is to be appreciated that various adaptations and modifications may be made and the invention is only to be limited by the appended claims.

We claim:

1. A signal generator including periodic self-calibration, including
   a reference frequency souce for producing a fixed frequency signal,
   a voltage controlled oscillator (VCO) for producing a variable frequency signal in accordance with a voltage input to the VCO,
   an adjustable dividing network coupled to the VCO and responsive to the variable frequency signal for dividing the variable frequency signal by a particular divider (N) in accordance with the adjustment of the dividing network and producing an output signal equal to the variable frequency signal divided by N,
   phase detector means coupled to the reference frequency source and the dividing network and responsive to the fixed frequency signal and the output signal for producing an error voltage in accordance with the difference between the fixed frequency signal and the output signal,
   a programmable nonvolatile storage means for storing a plurality of individual values representative of a plurality of frequency steps from the VCO,
   converter means coupled to the programmable nonvolatile storage means and responsive to the individual stored values for converting the stored values to a plurality of individual voltages,
   means coupled to the phase detector means and the converter means and responsive to the error voltage and the individual voltages for summing the voltages and applying the summed voltages to the VCO for controlling the VCO to particular frequency steps,
   means for providing a fixed reference voltage,
   second means responsive to the error voltage for comparing the error voltage to the fixed reference voltage for producing a control signal in accordance with the comparison,
   means responsive to a value of the control signal different from zero for incrementaly adjusting the individual voltage from the converter means in a direction to reduce the value of the control signal to zero,
   control means coupled to the second means and the programmable nonvolatile storage means and responsive to a zero value for the control signal for reprogramming the reprogrammable nonvolatile storage means in accordance with the value of the individual voltage providing a zero value in the control signal and
   means responsive to the reprogramming of the reprogrammable nonvolatile storage means for adjusting the value of N to initiate a calibration of the variable frequency signal divided by the new value of N.

2. The signal generator of claim 1 wherein the first means for producing an error voltage signal representative of the error signal is a loop filter.

3. The signal generator of claim 1 wherein the programmable nonvolatile storage means is a look-up table to store the individual values in digital form.

4. The signal generator of claim 3 wherein the converter means is a digital to analog converter (DAC).

5. The signal generator of claim 1 wherein the second means is a voltage comparator.

6. The signal generator of claim 1 wherein the control means is a part of a microprocessor.

7. The signal generator of claim 1 wherein both the programmable nonvolatile storage means and the control means form part of a microprocessor.

8. The signal generator of claim 7 wherein the programmable nonvolatile storage means included in the microprocessor is a look-up table to store the individual values in digital form, the control means included in the microprocessor incrementally controlling the digital values in the look-up table in accordance with the control signal.

9. The signal generator of claim 8 wherein the second means is a comparator to produce an on/off control signal to control the incremental control of the digital values.

10. The signal generator of claim 9 wherein the converter means is a digital to analog converter (DAC).

11. A calibration circuit for providing periodic recalibration of a signal generator of the type including a fixed reference frequency signal from a reference frequency source, a voltage controlled oscillator (VCO) for producing a variable frequency output signal, an adjustable dividing network coupled to the VCO and responsive to the variable frequency output signal for dividing the variable frequency output signal by a particular divider (N) to produce an output signal, and phase detector means coupled to the reference frequency source and the dividing network to produce an error voltage in accordance with the difference between the fixed frequency signal and the output signal, the calibration circuit including,
   programmable nonvolatile storage means for digitally storing a plurality of individual values representative of a plurality of frequency steps from the VCO, converter means coupled to the programmable storage means for converting the stored values to a plurality of individual voltages, means coupled to the phase detector means and the converter means for summing the error voltage and the individual voltages and applying the summed signals to the VCO for controlling the VCO to particular frequency steps, means for providing a fixed reference voltage, second means coupled to the phase detector means for comparing the error voltage to the fixed reference voltage for producing a control signal in accordance with the comparison, means responsive to a value different from zero from the second means for incrementally adjusting the individual voltage in a direction to reduce the error voltage to zero, control means coupled to the second means and the programmable nonvolatile storage means for reprogramming the individual value in the reprogrammable nonvolatile storage means upon a value of zero in the control voltage, and means responsive to a value of zero in the control voltage for operating upon the adjustable dividing network to change the value of N and to institute another calibration of the programmable nonvolatile storage means for the new value of N.

12. The calibration circuit of claim 11 wherein the programmable nonvolatile storage means is a look-up table to store the individual values in digital form.

13. The calibration circuit of claim 12 wherein the converter means is a digital to analog converter (DAC).

14. The calibration circuit of claim 11 wherein the second means is a voltage comparator.

15. The calibration circuit of claim 11 wherein the control means is a part of a microprocessor.

16. The calibration circuit of claim 11 wherein both the programmable nonvolatile storage means and the control means form part of a microprocessor.

17. The calibration circuit of claim 16 wherein the programmable nonvolatile storage means included in the microprocessor is a look-up table to store the individual values in digital form, the control means included in the microprocessor incrementally controlling the digital values in the look-up table in accordance with the control signal.

18. The calibration circuit of claim 17 wherein the second means is a comparator to produce an on/off control signal to control the incremental control of the digital values.

19. The calibration circuit of claim 18 wherein the converter means in a digital to analog converter (DAC).

20. A method of providing periodic recalibration of a signal generator of the type including means for providing a fixed reference frequency signal, a voltage controlled oscillator (VCO) for producing a variable frequency signal, an adjustable dividing network coupled to the VCO and responsive to the variable frequency signal to divide the variable frequency signal by a particular divider (N) and phase detector means coupled to the reference frequency means and the dividing network to produce an error voltage in accordance with the difference between the fixed frequency signal and the frequency-divided output signal, the method including the following steps:

storing a plurality of individual values representative of a plurality of frequency steps from the VCO, converting the stored value for the particular value of N to a plurality of individual voltages, summing the error voltage and the individual voltage and applying the summed voltage to the VCO for controlling the operation of the VCO, providing a fixed reference voltage, comparing the error voltage to the fixed reference voltage for producing a control signal in accordance with the comparison, incrementally increasing the individual voltage for the particular value of N to obtain a new sum of the error voltage and the individual voltage and a comparison of the resultant error voltage with the fixed reference, storing the incremented individual value for the particular value of N when the error voltage is reduced to zero, and converting the stored value for the next value of N to an individual voltage for the operations of summing, comparing, incrementing and storing as recited above.

21. The method of claim 20 wherein the individual values are stored in a look-up table in digital form.

22. The method of claim 21 wherein the stored values are converted from a digital to an analog form.

23. The method of claim 20 wherein the reprogramming is provided by a microprocessor.

24. The method of claim 20 wherein both the reprogramming and the storing of individual values is provided by a microprocessor.

25. The method of claim 20 wherein the storing of the individual values is in a look-up table and is in digital form and the reprogramming including the step of incrementally controlling the digital values in the look-up table in accordance with the control signal.

26. The method of claim 25 wherein the step of comparing includes producing an on/off control signal to control the incremental control of the digital values.

27. The method of claim 26 wherein the step of converting includes converting from a digital to analog form.

* * * * *